United States Patent [19]

Yamaguchi

[11] Patent Number: 5,036,491
[45] Date of Patent: Jul. 30, 1991

[54] MULTIPORT SEMICONDUCTOR MEMORY INCLUDING AN ADDRESS COMPARATOR

[75] Inventor: Akira Yamaguchi, Yokohama, Japan

[73] Assignee: Kabushiki Kaisha Toshiba, Kawasaki, Japan

[21] Appl. No.: 291,453

[22] Filed: Dec. 28, 1988

[30] Foreign Application Priority Data

Jan. 7, 1988 [JP] Japan .................................. 63-1659

[51] Int. Cl.$^5$ .............................................. G11C 7/00
[52] U.S. Cl. ........................... 365/189.07; 365/189.04; 365/230.05
[58] Field of Search ...................... 365/189.04, 230.05, 365/230.06, 189.07, 190

[56] References Cited

U.S. PATENT DOCUMENTS

| | | | |
|---|---|---|---|
| 4,577,292 | 3/1986 | Bernstein | 365/189.07 |
| 4,599,708 | 7/1986 | Schuster | 365/189.04 |
| 4,616,347 | 10/1986 | Bernstein | 365/230.06 |
| 4,742,487 | 5/1988 | Bernstein | 365/195 |
| 4,757,477 | 7/1988 | Nagayama et al. | 365/230.05 |

FOREIGN PATENT DOCUMENTS

| | | | |
|---|---|---|---|
| 0130494 | 8/1983 | Japan | 365/230.05 |
| 0198585 | 11/1984 | Japan | 365/189.04 |
| 0008791 | 1/1986 | Japan | 365/189.04 |
| 0128341 | 6/1987 | Japan . | |
| 0146483 | 6/1987 | Japan | 365/189.04 |

Primary Examiner—Glenn Gossage
Attorney, Agent, or Firm—Finnegan, Henderson, Farabow, Garrett and Dunner

[57] ABSTRACT

A multi-port-type semiconductor memory including an address comparator comprises a memory cell array which includes a plurality of memory cells arranged in rows and which includes two pairs of word lines for selecting the memory cells. The two word line pairs are driven each by one of two row decoders to which independent address signals are supplied. The address signals supplied to the two row decoders are input to the address comparator so as to detect coincidence between these signals. Further, a control circuit is provided in the semiconductor memory in order to inhibit the operation of one of the two row decoders when coincidence between the address signals is detected by the address comparator.

7 Claims, 8 Drawing Sheets

| MODE | PORT 0 | PORT 1 | WORD LINE | |
|---|---|---|---|---|
| | | | WL 0 | WL 1 |
| 1 | — | — | 0 | 0 |
| 2 | READ | — | 1 | 0 |
| 3 | — | READ | 0 | 1 |
| 4 | READ | READ | 1 | 1 |
| 5 | READ | WRITE | 1 | 1 |
| 6 | WRITE | READ | 1 | 1 |
| 7 | WRITE | — | 1 | 0 |
| 8 | — | WRITE | 0 | 1 |

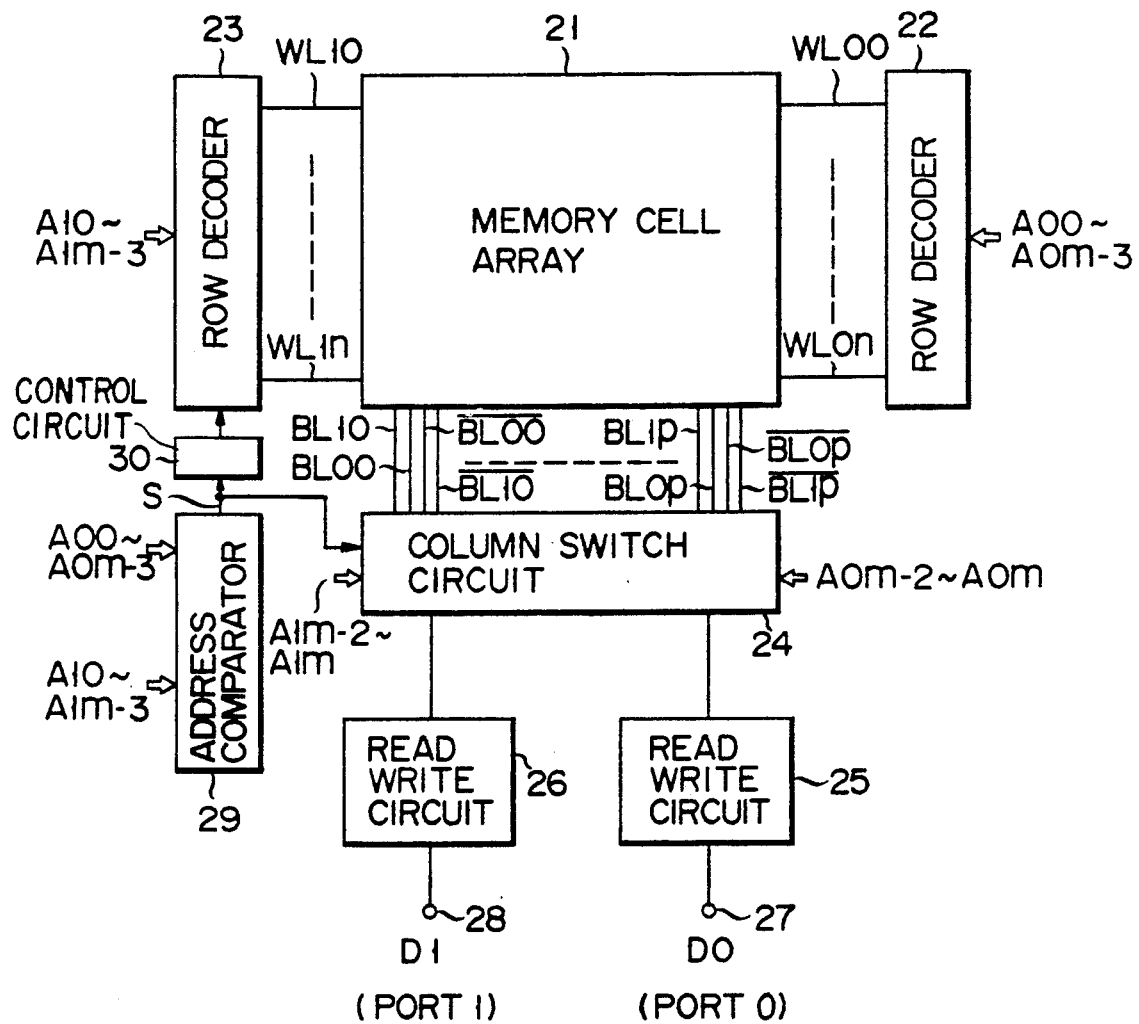
F I G. 3

| MODE | PORT0 | PORT1 | WORD LINE WL0 | WL1 | S |
|---|---|---|---|---|---|
| 1 | — | — | 0 | 0 | — |
| 2 | READ | — | 1 | 0 | 0 |
| 3 | — | READ | 0 | 1 | 0 |
| 4 | READ | READ | 1 | 0 | 1 |
| 5 | READ | WRITE | 1 | 0 | 1 |
| 6 | WRITE | READ | 1 | 0 | 1 |
| 7 | WRITE | — | 1 | 0 | 0 |
| 8 | — | WRITE | 0 | 1 | 0 |

FIG. 4

| MODE | PORT 0 | PORT 1 | WL 0 | WL 1 | ØR0 | ØR1 | ØW0 | ØW1 | S |
|---|---|---|---|---|---|---|---|---|---|
| 1 | — | — | 0 | 0 | — | — | — | — | — |
| 2 | READ | — | 1 | 0 | 1 | — | 0 | — | 0 |
| 3 | — | READ | 0 | 1 | — | 1 | — | 0 | 0 |
| 4 | READ | READ | 1 | 0 | 1 | 1 | 0 | 0 | 1 |
| 5 | READ | WRITE | 1 | 0 | 1 | 0 | 0 | 1 | 1 |
| 6 | WRITE | READ | 1 | 0 | 0 | 1 | 1 | 0 | 1 |
| 7 | WRITE | — | 1 | 0 | 0 | — | 1 | — | 0 |
| 8 | — | WRITE | 0 | 1 | — | 0 | — | 1 | 0 |

MULTIPORT SEMICONDUCTOR MEMORY INCLUDING AN ADDRESS COMPARATOR

BACKGROUND OF THE INVENTION

1. Field of the Invention

This invention relates to a semiconductor memory device of the random access type, which performs independent read and write operations through a plurality of ports.

2. Description of the Related Art

A semiconductor memory device of the random access type in which the read and write operations are independently performed through two ports, has been known as a 2-port RAM. A portion including a single memory cell in the 2-port RAM is schematically illustrated in FIG. 1. A pair of inverters connected in a back-to-back fashion make up flip-flop (F/F) 11 retaining one-bit complementary data. Transfer gates 12 and 13 are coupled at node N1 retaining one of the complementary data. Transfer gates 14 and 15 interconnect at node N2 retaining the other of the complementary data. Two pairs of bit lines BL0 and $\overline{BL0}$, and BL1 and $\overline{BL1}$ are provided. Transfer gate 12 is connected between bit line BL0 and node N1. Similarly, transfer gate 13 is connected between bit line BL1 and node N1. Transfer gate 14 is connected between bit line $\overline{BL0}$ and node N2. Transfer gate 15 is connected between bit line $\overline{BL1}$ and node N2. The gates of transfer gates 12 and 14 are connected together to word line WL0; the gates of transfer gates 13 and 15 are connected together to word line WL1.

In the above memory cell, when word line WL0 is driven, transfer gates 12 and 14 are conductive, and nodes N1 and N2 of F/F 11 are coupled with bit lines BL0 and $\overline{BL0}$, respectively. At this time, the data retained in F/F 11 is read out onto bit line pair BL0 and $\overline{BL0}$, or data supplied onto this bit line pair is written into F/F 11. When word line WL1 is driven, transfer gates 13 and 14 are conductive, and nodes N1 and N2 of F/F 11 are coupled with bit lines BL1 and $\overline{BL1}$, respectively. At this time, the data retained in F/F 11 is read out onto bit line pair BL1 and $\overline{BL1}$, or data supplied on this bit line pair is written into F/F 11.

Combinations of read and write operations possibly performed for the 2-port RAM including a number of such memory cells arrayed in a matrix fashion are as shown in FIG. 2. The operation modes of the RAM may be categorized into three types: mode 1 in which neither port 0 or port 1 is selected; modes 2, 3, 7, 8 in which either port 0 or port 1 is selected; modes 4, 5 and 6 in which both port 0 and port 1 are selected. Port 0 indicates a terminal connecting to bit line pair BL0 and $\overline{BL0}$ through which data is written to and read out of the memory cell. Port 1 indicates a terminal connected to bit line pair BL1 and $\overline{BL1}$ through which data is written to and read out of the memory cell. In each operation mode, when one port is selected, one of the bit line pairs BL0, $\overline{BL0}$ and BL1, $\overline{BL1}$ serves as a load, and no problem arises. When word lines WL0 and WL1 connected to memory cells in a row are both driven, and two ports are simultaneously selected, both the bit line pairs BL0, $\overline{BL0}$ and BL1, $\overline{BL1}$ serve as a load of F/F 11, and a problem arises. The problem follows. Before the read or write operation, bit line pairs BL0, $\overline{BL0}$ and BL1, $\overline{BL1}$ are precharged to "H" level by a precharge means (not shown). Subsequently, either of word lines WL0 and WL1 is driven, so that a pair of transfer gates connected to nodes N1 and N2, for example, transfer gates 12 and 14, are conductive, so that nodes N1 and N2 are connected to bit lines BL0 and $\overline{BL0}$, respectively. Let us consider a read operation of the memory device. It is assumed that when F/F 11 stores such data that "H" level is at node N1 and "L" level at node N2, transfer gates 12 and 14 are conductive, and the nodes are connected to bit lines BL0 and $\overline{BL0}$. After the nodes are connected to bit lines BL0 and $\overline{BL0}$, potential on bit line $\overline{BL0}$ changes from "H" to "L". In a circuit design, the drive ability of the inverters of F/F 11, for example, is selected on the assumption that such a potential change in bit lines is performed at a predetermined rate, with the bit lines respectively connecting to nodes N1 and N2. In a situation when two ports are selected and two bit lines are connected to nodes N1 and N2, two bit lines in "H" level must be discharged at the node set in "L" level in F/F 11. A rate of potential change in both the bit lines from "H" to "L" is lower than that in a single line. In such a situation, when a load varies, the read characteristic of the memory device, and the write characteristic as well varies.

SUMMARY OF THE INVENTION

Accordingly, an object of the present invention is to provide a semiconductor memory device which independently performs the read and write operations through a plurality of ports, and even when a plurality of ports are simultaneously selected, maintains stable read and write characteristics.

To achieve the above object, there is provided a semiconductor memory device comprising:

A memory cell array made up of a plurality of memory cells arrayed in a matrix fashion, a plurality of groups of select lines for selecting the memory cells arrayed in rows in the memory cell array, a plurality of groups of data line pairs, each connected to a plurality of memory cells arrayed in rows, a plurality of select line drive circuits for selecting the select lines in the respective groups of select lines in response to address signals respectively applied to the select line drive circuits, the number of the select line drive circuits being equal to that of the groups of select lines, an address coincidence detecting circuit for detecting a coincidence of the address signals supplied to the plurality of select line drive circuits, and a control circuit for selecting one of said plurality of select line drive circuits, and prohibiting the remainder of the plurality of select line drive circuits from selecting and driving operation.

BRIEF DESCRIPTION OF THE DRAWINGS

FIG. 3 is a block diagram showing an overall arrangement of a semiconductor memory device according to the present invention, which is implemented in the form of a 2-port RAM;

FIG. 4 is a table showing relationships among operation modes, states of ports, and logical states in word lines in RAM of FIG. 3;

DETAILED DESCRIPTION OF THE PREFERRED EMBODIMENTS

Preferred embodiments of a semiconductor memory device according to the present invention will be described in detail with reference to the accompanying drawings.

Figures 1, 2:
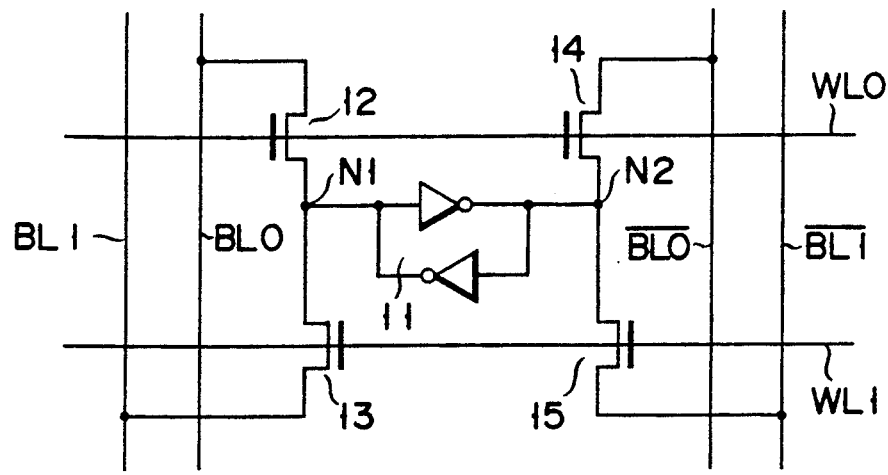
FIG. 1 is a circuit diagram showing a memory cell used in a semiconductor memory device according to the present invention.
FIG. 2 is a table showing relationships among operation modes, states of ports, and logical states in word lines in the memory cell of FIG. 1.

Reference is first made to FIG. 3 showing an overall arrangement of a semiconductor memory device according to the present invention. In the figure, reference numeral 21 designates a memory cell array in which a plurality of memory cells of substantially the same structure as that of FIG. 1 are arrayed in a matrix fashion. Word lines grouped WL00 to WL0n in the circuit section of port 0 of array 21 are selectively driven by a row decoder 22 of the clock synchronizing type, which is supplied with row address signals A00 to A0m-3 in the port 0 section. Similarly, word lines grouped WL10 to WLln in the section of port 1 of array 21 are selectively driven by a row decoder 23 of the clock synchronizing type, which is supplied with row address signals A10 to A1m-3 in the section of port 0. Two groups of paired bit lines BL00, $\overline{BL00}$ to BL0p, $\overline{BL0p}$, and BL10, $\overline{BL10}$ to BL1p, $\overline{BL1p}$ are coupled with column switch circuit 24. Switch circuit 24 is supplied with two groups of column address signals A0m-2 to A0m for port 0, and column address signals A1m-2 to A1m for port 1. In accordance with the respective address signals applied, switch circuit 24 selects two pairs of bit lines from the groups of bit line pairs BL00, $\overline{BL00}$ to BL0p, $\overline{BL0p}$ and BL10, $\overline{BL10}$ to BL1p, $\overline{BL1p}$, and connects them to either read/write circuit 25 for port 0 or read/write circuit 26 for port 1. In a write mode, read/write circuits 25 and 26, respectively, supply to the two pairs of bit lines selected by column switch circuit 24, data D0 and D1 supplied at terminals 27 and 28 for port 0 and port 1. In a read mode, read/write circuits 25 and 26, respectively, detect the data on the two pairs of bit lines selected by column switch circuit 24, and supply the detected data to terminals 27 and 28 for port 0 and port 1.

Address comparator 29 detects the coincidence of row address signals A00 to A0m-3 input to row decoder 22 in port 0 and row address signals A10 to A1m-3 input to row decoder 23 for port 1, and outputs a coincident signal S. This signal S is applied through control circuit 30 to row decoder 23, and also to column switch circuit 24. Control circuit 30 controls the decoding operation of row decoder 23 in accordance with coincidence signal S.

FIG. 4 tabulates combinations of the read/write operations and states of coincidence signal S in the RAM of the present embodiment.

In the RAM thus arranged, address comparator 29 detects the coincidence of row address signals A00 to A0m-3 in port 0 and A10 to A1m-3 for port 1, and outputs a coincident signal S. Then, control circuit 30 prohibits row decoder 23 in the port 1 section from executing a decode operation. No operation is performed to select the word lines WL10 to WLln of the memory cells in the circuit section of port 1 in memory cell array 21, but the word line select operation is performed for the word lines WL00 to WL0n of the memory cells for port 0 in array 21.

When coincident signal S is produced, column switch circuit 24 selects two pairs of bit lines from those bit lines BL00, $\overline{BL00}$, BL0p, $\overline{BL0p}$ on the basis of row address signals A0m-2 to A0m for port 0 and A1m-2 to A1m for port 1, and connects them to read/write circuits 25 and 26. Subsequently, the read or write operation is performed through read/write circuits 25 and 26.

As seen from the foregoing description, in the RAM of the present embodiment, when the row address of port 0 is equal to that for port 1, the two word lines WL0 and WL1 of the memory cells arrayed on the same row in memory cell array 21 will never be driven. Therefore, the memory device of the present embodiment is free from the variation in the read/write characteristics.

Figure 5:
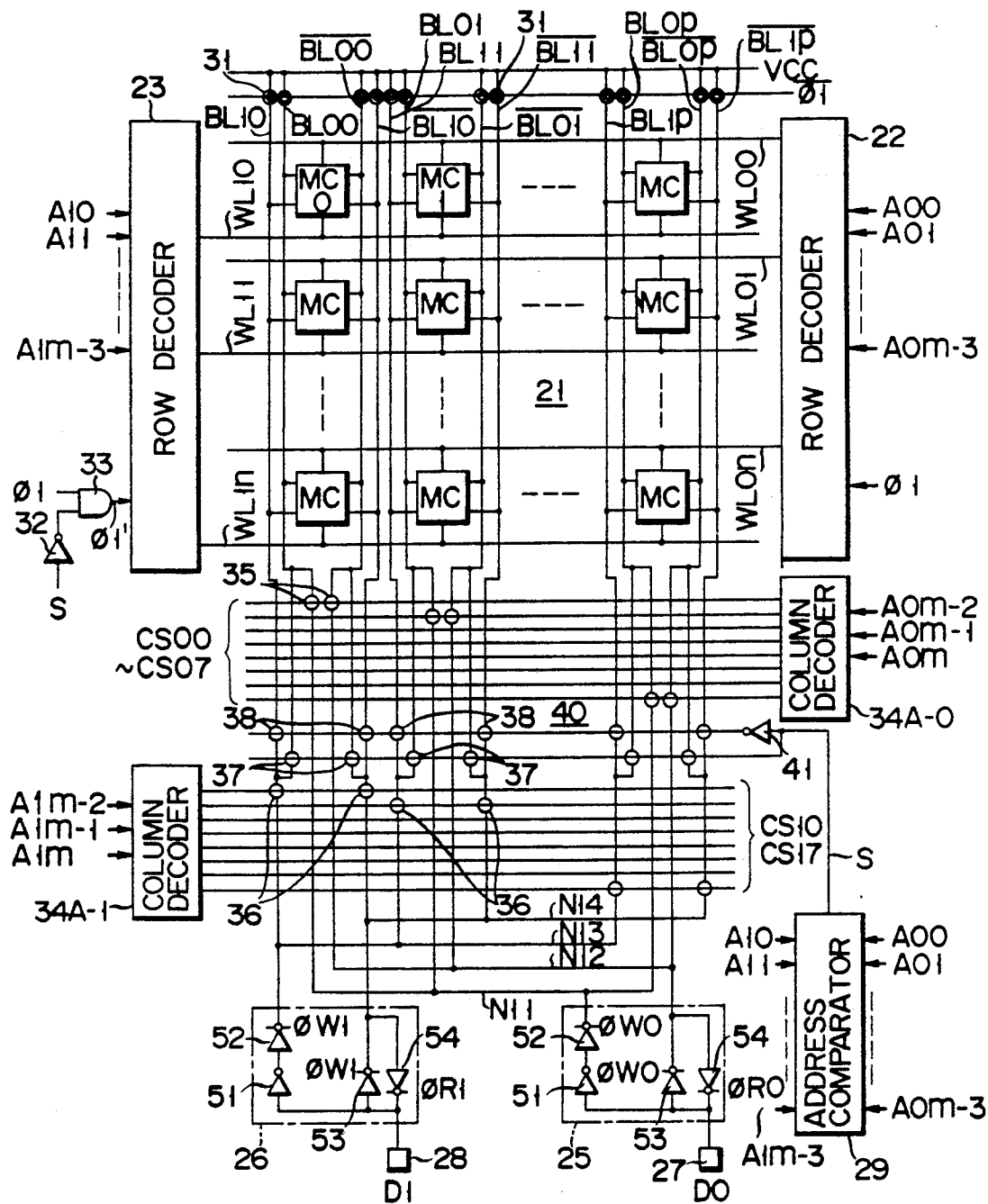
FIG. 5 is a circuit diagram showing the details of the RAM of FIG. 3.

FIG. 5 is a circuit diagram showing the details of the RAM illustrated in block form in FIG. 3. In FIG. 5, like reference symbols designate like or equivalent portions in FIG. 3, for simplicity. As shown, in memory cell array 21, a number of memory cells MC are arranged in a matrix array. The memory cells arrayed in a column are connected to two bit line pairs BL0i, $\overline{BL0i}$, and BL1i, $\overline{BL1i}$ (i=0, 1, . . . , p). P channel MOS transistor 31 for precharge is connected between each bit line and power source potential Vcc amounting to logical "H" level. These transistors 31 receive at their gates a pulse signal $\phi 1$ which is activated at time of precharge. Pulse signal $\phi 1$ is applied to row decoder 22 for port 0, in addition to row address signals A00 to A0m-3. This row decoder 22 is of the synchronizing type, and decodes the row address signals A00 to A0m-3 when the pulse signal $\phi 1$ is activated. Row decoder 23 for port 1 is supplied with row address signals A10 to A1m-3. Control circuit 30 in FIG. 3 is made up of inverter 32 and AND gate 33. Inverter 32 inverts coincidence signal S. AND gate 33 forms pulse signal $\phi 1'$ by using the output signal of inverter 32 and pulse signal $\phi 1$. The formed pulse signal $\phi 1'$ is to be used as a sync pulse in row decoder 23. The row decoder 23 is of the synchronizing type, and decodes the row address signal A11 to A1m-3 when the pulse signal $\phi 1'$ is activated.

Column switch circuit 24 in FIG. 3 is made up of column decoder 34A-0, column decoder 34A-1, and switch circuit 40. Decoder 34A-0 selects and drives eight column select lines CS00 to CS07 by column address signals of three bits A0m-2, A0m-1, and A0m for port 0. Decoder 34A-1 selects and drives eight column select lines CS10 to CS17 by column address signals of three bits A1m-2, A1m-1, and a1m for port 1.

Paired MOS transistors 35 are respectively inserted between paired bit lines BL0i and $\overline{BL0i}$ and two nodes N11 and N12 respectively. These pairs of transistors 35 are coupled at the gates with eight column select lines CS00 to CS07, respectively. Paired MOS transistors 36 are respectively inserted between paired bit lines BL1i and $\overline{BL1i}$ and two nodes N13 and N14. The pairs of transistors 36 are coupled at the gates with eight column select lines CS10 to CS17, respectively. Paired transistors 37 are respectively inserted between paired bit lines BL0i and $\overline{BL0i}$ and paired transistors 36. Paired transistors 38 are respectively inserted between paired bit lines BLli and $\overline{BLli}$ and paired transistors 36. Coincident signal S is directly applied to the gates of paired transistors 37, and through inverter 41 to the gates of paired transistor 38.

Read/write circuit 25 in the circuit section of port 0 is made up of one inverter 51 and three clocked inverters 52, 53 and 54. Inverter 51 inverts the data applied to terminal 27. Inverter 52 inverts the output signal of inverter 51 in synchronism with pulse signals $\phi W0$ and its inverse signal activated in a read mode, and supplies the inverse signal to node N11 in column switch circuit 24. Inverter 53 inverts the data at terminal 27 in synchronism with pulse signal $\phi W0$, and supplies the inverse signal to node N12 in column switch circuit 24. Inverter 54 inverts the data of node N12 in synchronism with pulse signal $\phi R0$ activated in a read mode, and supplies the inverse signal to terminal 27. The read/write circuit 26 in the circuit section of port 1 is also arranged like the above. The circuit 26 substitutes terminal 27 for terminal 28, nodes N11 and N12 for N13 and N14, pulse signals $\phi W1$ and its inverse signal for pulse signals $\phi W0$ and its inverse, and pulse signal $\phi R1$ and its inverse for $\phi R0$ and its inverse.

Figures 6, 7:
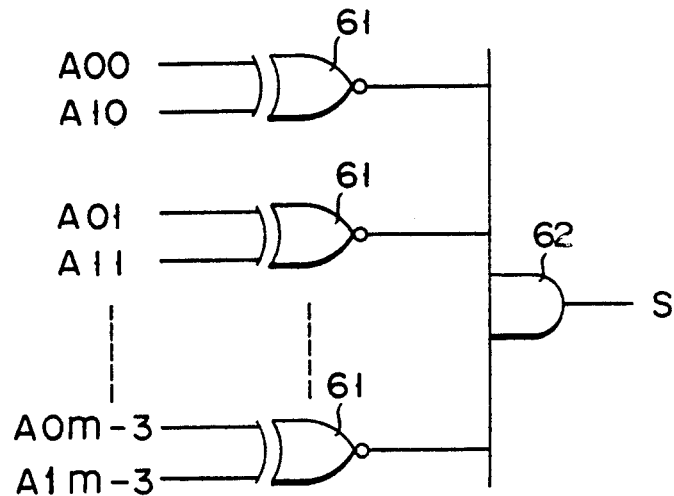
FIG. 6 is a circuit diagram showing the details of a part of the RAM of FIG. 3.
FIG. 7 is a table showing relationships among operation modes, states of ports, logical states in word lines and of other key signals in the RAM of FIG. 5.

Address comparator 29 is arranged as shown in FIG. 6, for example. As shown, comparator 29 is made up of (m-2) exclusive OR gates 61 which are coupled with row address signals A00 to A0m-3 in the port 0 section, and row address signals A10 to A1m-3 In the port 0 section, and AND gate 62 receiving the output signals of the (m-2) exclusive OR gates 61.

FIG. 7 tabulates combinations of the read/write operations, and states of signals on word lines WL0 and WL1, various pulse signals and coincidence signal S in the RAM illustrated In detail In FIG. 5.

The operation of the 2-port RAM of FIG. 5 will be described with reference to the timing charts of FIGS. 8 and 9. Timing charts of FIG. 8 describe a read operation of the RAM through the two ports when the row address applied to port 0 is the same as that to port 1. Before the detailed operative description, it is assumed that in the port 0 section, a memory cell selected by the input address signal is connected to word line WL00, and bit line pairs BL00, $\overline{BL00}$, and BL10 and $\overline{BL10}$ (this memory cell will be denoted as MC0), and in the port 1 section, a memory cell selected by the input address signal is connected to word line WL00, and bit line pairs BL01, $\overline{BL01}$, and BL11 and $\overline{BL11}$ (this memory cell will be denoted as MC1 in FIG. 5), and that "H" data has been stored in both the memory cells MC0 and MC1.

Figure 8:
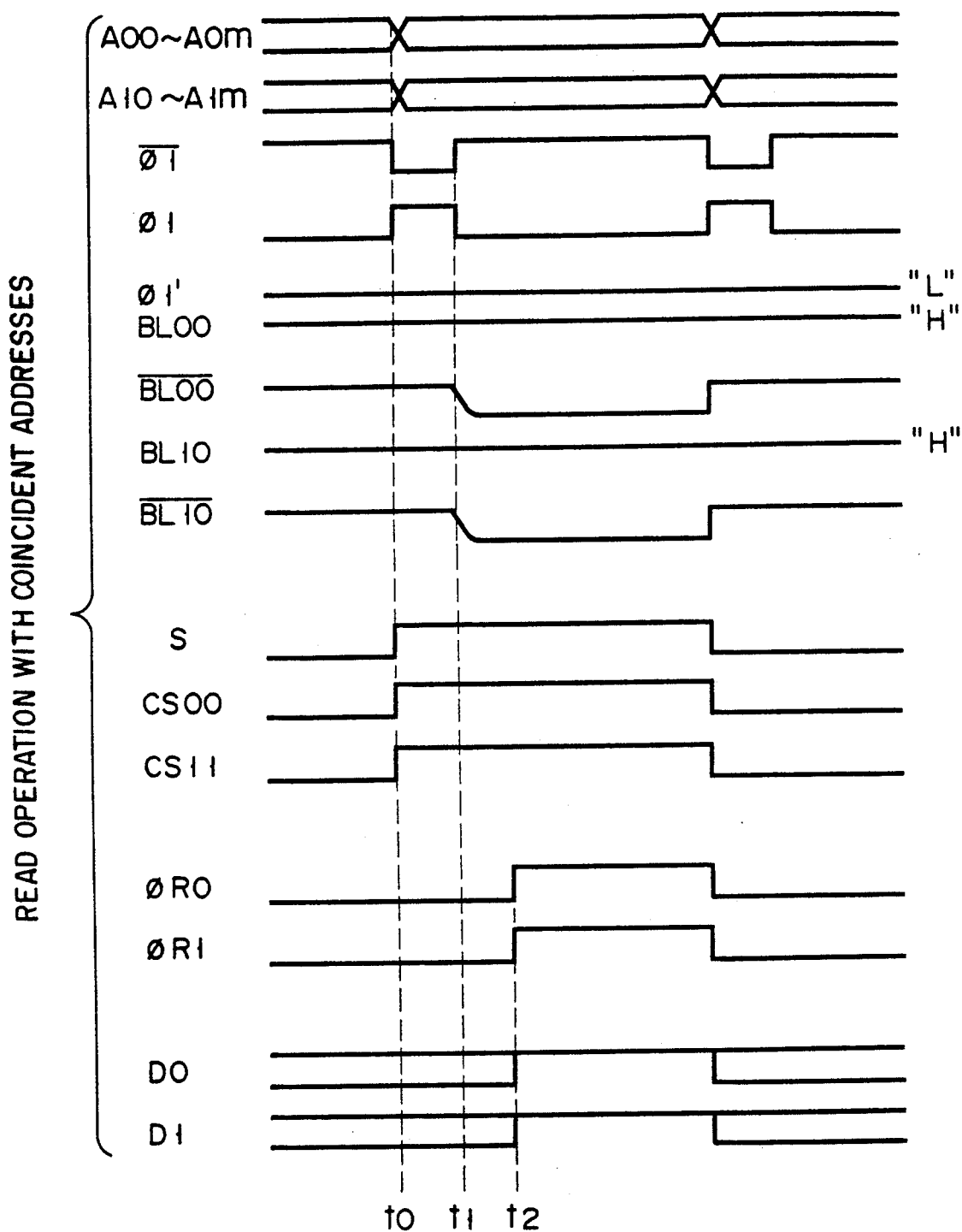
FIG. 8 is timing charts useful in explaining the operation of the RAM of FIG. 5.

At time t0 in FIG. 8, the address signals are input to the RAM. Since the row address signals A00 to A0m-3 in the port 0 section are the same as those A10 to A1m-3 in the port 1 section, address comparator 29 produces coincidence signal S of "H" level. Since both the address signals A00 to A0m-3 and A10 to A1m-3 are equal, the output signals of exclusive OR gates of (m-2) are all "H" signals. Coincidence signal S output from AND gate 62 goes high ("H"). At this time, pulse signal $\phi 1$ is activated, the precharge transistors 31 connected to the respective bit lines are all turned on, and all of the bit lines are precharged to "H" level.

At time t1, the activation of signal $\phi 1$ terminates, and row decoder 22 starts the select operation of a single word line WL00 for port 0. In turn, data is read out from the memory cells including MC0 and MC1, which are coupled with the word line. Discharge of bit lines $\overline{BL00}$ and $\overline{BL01}$ to "L" level starts on the basis of the date stored in memory cells MC0 and MC1. Since the word line WL10 for port 1 remains "L" level, no signal path is set up between memory cell MC0 and bit line pair BL10 and $\overline{BL10}$, and between memory cell MC1 and bit line pair BL11 and $\overline{BL11}$.

Upon receipt of the address signals at time t0, in column decoder 34A-0 for port 0, one column select line CS00 is selected, to turn on a couple of transistors 35 connected respectively between bit line pair BL00 and $\overline{BL00}$ and nodes N11 and N12. On the other hand, also in column decoder 34A-1 for port 1, a single column select line CS11 is selected, to turn on a couple of transistors 36 connected respectively between bit line pair BL11 and $\overline{BL11}$ and nodes N13 and N14. Since coincidence signal S is "H" in logical level, transistors 37 are conductive, but transistors 38 are nonconductive. Under this condition, bit line pair BL01 and $\overline{BL01}$ through which the data is read out from memory cell MC1, are connected to bit line pair BL11 and $\overline{BL11}$, through transistors 37.

Subsequently, at time t2, pulse signals $\phi R0$ and $\phi R1$ are activated. Upon activation of these pulse signals, the clocked inverter 54 in read/write circuit 25 for port 0 operates to invert the signal level at node N12, and outputs it as read out data D0 from terminal 27. At the same time, the clocked inverter 54 in read/write circuit 26 for port 1 also operates to invert the signal level at node N14, and outputs it as read out data D1 from terminal 28. In this way, data D0 and D1 are read out through ports 0 and port 1. It is noted that word lines of the memory cells arrayed in the same row in the port 1 and port 2 sides are not simultaneously driven. Therefore, the read characteristic of the RAM will never be influenced by the read operation, and therefore is stable.

Figure 9:
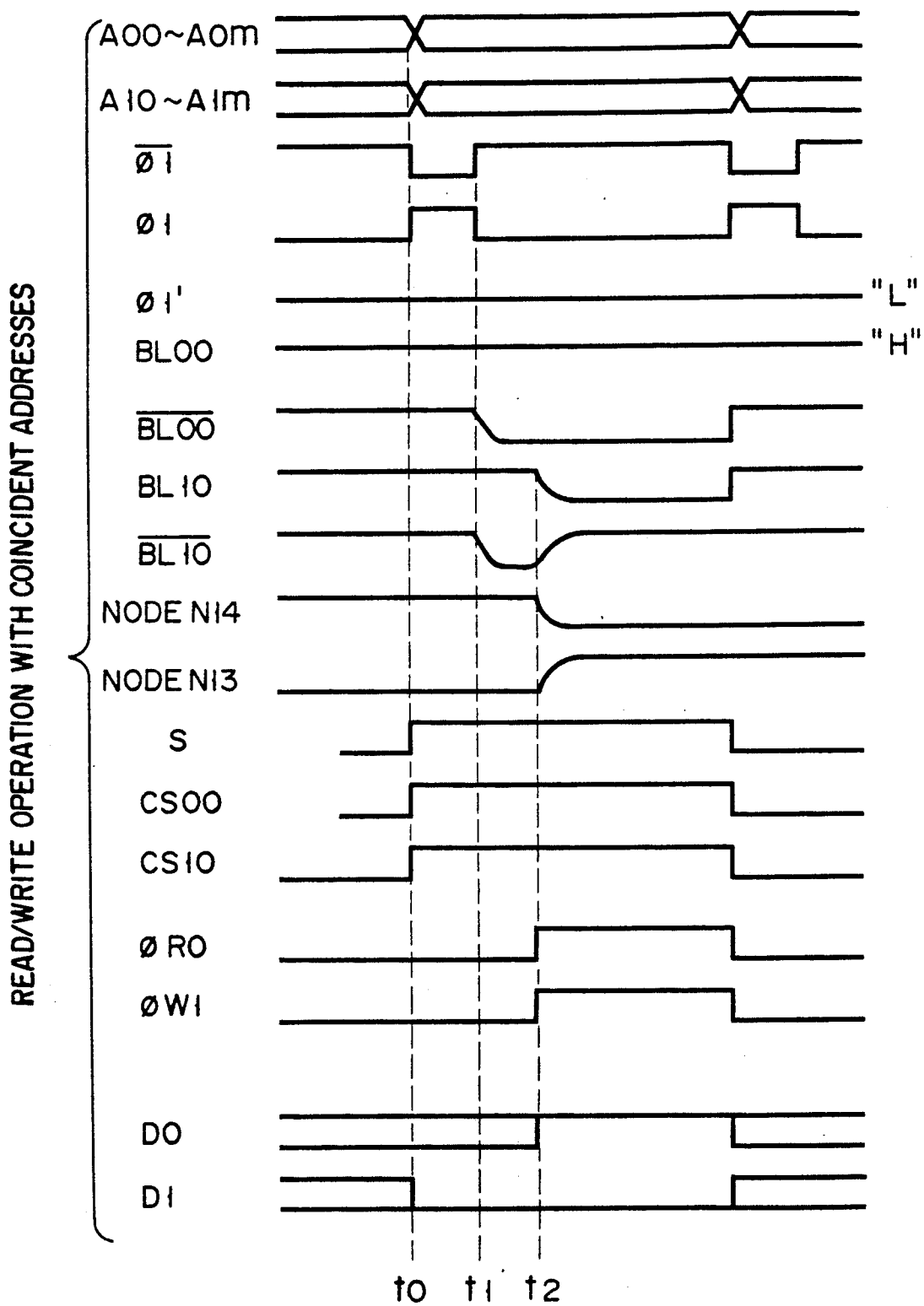
FIG. 9 is timing charts useful in explaining the operation of the RAM of FIG. 5.

The timing charts shown in FIG. 9 are useful in explaining the operation of the RAM when "H" data is read out of memory cell MC0 for port 0, while "L" data is written into memory cell MC1 for port 1.

In FIG. 9, at time t0 data is input. Since the row address signals A00 to A0m-3 in the port 0 section is the same as those A10 to A1m-3 in the port 1 section, address comparator 29 produces coincidence signal S of "H" level. At this time, pulse signal $\phi 1$ is activated, and the precharge transistors 31 connected to the respective bit lines are all turned on, and all of the bit lines are precharged to "H" level. At this time, in column decoder 34A-0 for port 0, one column select line CS00 is selected, to turn on a couple of transistors 35 connected respectively between bit line pair BL00 and $\overline{BL00}$ and nodes N11 and N12. On the other hand, also in column decoder 34A-1 for port 1, a single column select line CS11 is selected, to turn on a couple of transistors 36 connected respectively between bit line pair BL11 and $\overline{BL11}$ and nodes N13 and N14.

At time t1, the activation of signal $\phi 1$ terminates, and row decoder 22 starts the select operation of a single word line WL00 for port 0, and consequently selects the memory cells including MC0 and MC1, which are coupled with the word line. Since coincidence signal S has been "H" in logical level, transistors 37 are conductive, but transistors 36 are nonconductive. Under this condition, memory cell MC0 is connected to nodes N11 and N12, and memory cell MC1 is connected to nodes N13 and N14. Bit line $\overline{BL00}$ changes its logical level to "L" level according to the stored data of the memory cell MC0, so that node N12 also changes its logical level to "L" level. Subsequently, at time t2, pulse signal $\phi R0$ is activated. Upon activation of the pulse signals, the clocked inverter 54 in read/write circuit 25 for port 0 operates to invert the signal level at node N12, and outputs it as read out data D0 from terminal 27.

Also at time t0, write data of "H" level is input to the terminal 28 for port 1. Bit line $\overline{BL00}$ changes its logical level to "L" level according to the previously stored data of the memory cell MC1. At time t2, pulse signal φW1 is activated. Upon activation of the pulse signal, the clocked inverters 52 and 53 in read/write 26 for port 1 operate, so that the data in the same level as that of the write data is applied to node N13, while the inverse data of the write data is applied to node N14; As a result, the logical level at nodes N13 and N14 is inverted, and the data whose logical level is inverse to the previous one is written into memory cell MC1. In this way, data is read out from the memory cell through port 0, while at the same time data is written into the memory cell through port 1. Also in this instance, there never occurs such a situation that the word lines for port 0 and port 1 are simultaneously driven. Therefore, the read/write characteristics are stable.

Data may be written into the memory cell through port 0, and data may be read out from the memory cell through port 1 in a similar way. Difference from FIG. 9 timing chart resides in only that the memory cells to be accessed are interchanged. Also in this operation, the stable read/write characteristics can be secured.

Figure 10:
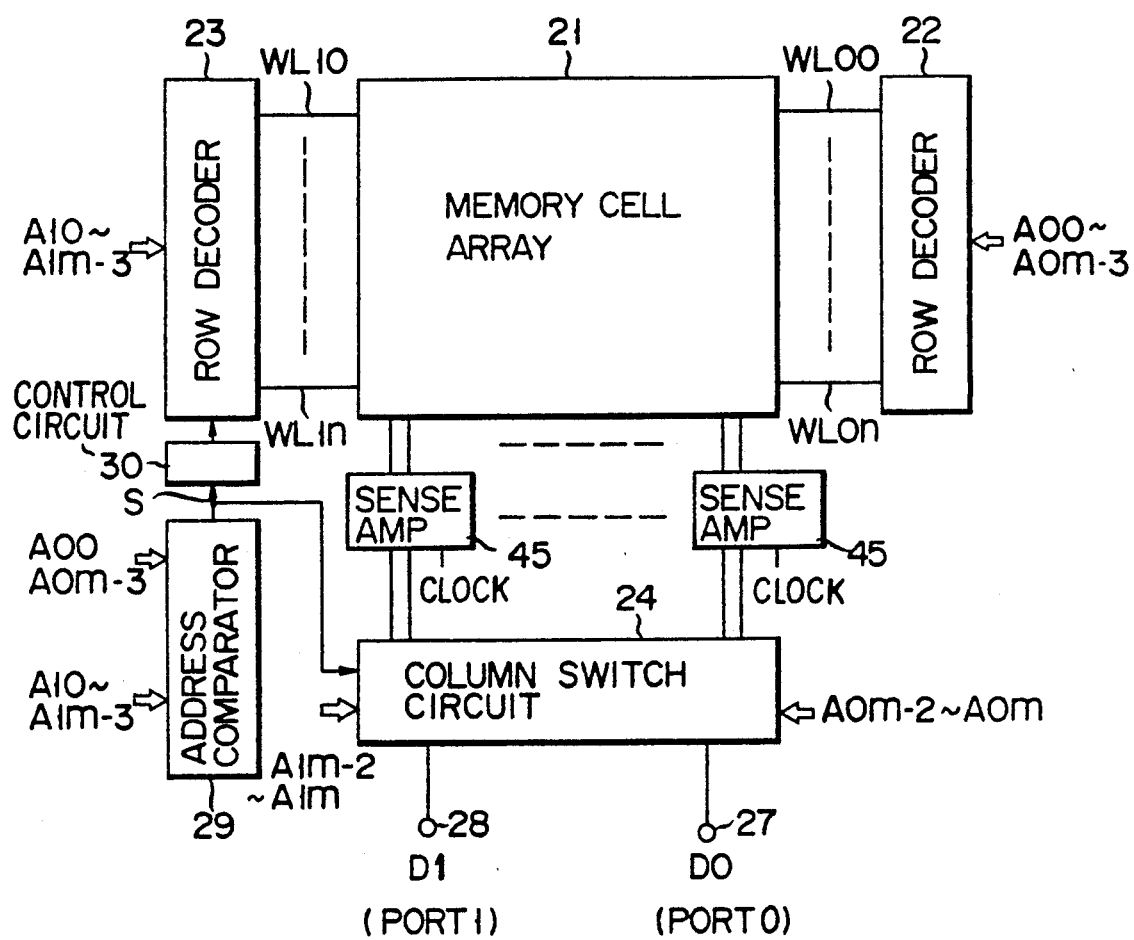
FIG. 10 is a block diagram showing an overall arrangement of another semiconductor memory device according to the present invention, which is implemented in the form of a 2-port RAM.

In FIG. 10, there is shown a semiconductor memory device according to another embodiment of the present invention. The memory device is also a 2-port RAM. While in the first embodiment, read/write circuits 25 and 26 are inserted between column switch circuit 24 and terminals 27 and 28, sense amplifiers 45, which are controlled by a clock signal for each bit line pair, are provided between memory cell array 21 and column switch circuit 24.

It is evident that the present invention may be variously changed and modified within the scope of the invention. The present invention, which is implemented into the 2-port RAM in the above-mentioned embodiment, may also be applied for any other types of memory devices.

As described above, the present invention has successfully provided a semiconductor device which performs the read/write operation through a plurality of ports, and is operable with stable read/write characteristics even when a plurality of ports are simultaneously selected.

What is claimed is:

1. A semiconductor memory device comprising:
   a memory cell array made up of a plurality of memory cells arrayed in a matrix fashion;
   two groups of select lines for selecting the memory cells arrayed in rows in the memory cell array;
   first and second groups of data line pairs each connected to a plurality of memory cells in said array of memory cells;
   first and second row decoders for respectively selecting and driving the select lines in said two select line groups in response to independent row address signals;
   an address coincidence detecting circuit for detecting a coincidence of the address signal respectively supplied to said first and second row decoders;
   a first control circuit for prohibiting a selected one of said first and second row decoders from performing the select line drive operations when said address coincidence circuit detects a coincidence between the independent row address signals;
   first and second data line select circuits supplied with independent column address signals;
   a second control circuit controlled by an output signal of said address coincidence detecting circuit for causing said first and second data line select circuits to independently select one data line pair of said first and second groups of data line pairs respectively when a coincidence between said row address signals is not detected and for causing said first and second data line select circuits to select the same data line pair from one of said first and second groups of data line pairs when a coincidence between said row address signals is detected; and
   first and second read/write circuits coupled with the data lines respectively selected by said first and second data line select circuits.

2. The semiconductor memory device according to claim 1, wherein each of said memory cells includes
   a one bit of data retaining circuit for retaining data of; and
   transfer gates located between said data retaining circuit and said data lines, the number of said transfer gates being equal to that of the pairs of said select lines in said plurality of select line groups, and said transfer gates being turned on and off by the signals on the select lines in said plurality of select line groups.

3. The semiconductor memory device according to claim 11, wherein said address coincidence detecting circuit includes a plurality of exclusive OR gates coupled to recline paired address bit signals of said address signals which each consist of a plurality of bits and are supplied to said first and second row decoders.

4. The semiconductor memory device according to claim 1, wherein said first and second read/write circuits are located between said memory cell array and said first and second data line select circuits, respectively.

5. The semiconductor memory device according to claim 1, wherein said first and second data lines include each a pair of bit lines for transferring complementary data.

6. The semiconductor memory device according to claim 1, wherein:
   said first data line select circuit includes a first column decoder and a plurality of first switching elements, each being inserted between one of the data lines of said first group of data line pairs and said first read/write circuit, the states of said plurality of first switching elements being controlled in accordance with an output signal of said first column decoder; and
   said second data line select circuit includes a second column decoder and a plurality of second switching elements, each being inserted between one of the data lines of said second group of data line pairs and said second read/write circuit, the states of said plurality of second switching elements being controlled in accordance with an output signal of said second column decoder.

7. The semiconductor memory device according to claim 6, wherein said second control circuit includes a third switching element inserted between said one of the data lines of said first group of data line pairs and said second switching element, the conduction of said third switching element being controlled by the output signal of said address coincidence detecting circuit, and a fourth switching element inserted between said one of the data lines of said second group of data line pairs and said second switching element, the conduction of said fourth switching element being controlled by the output signal of said address coincidence detecting circuit in a complementary manner with respect to the conduction control of said second switching element.

* * * * *